United States Patent [19]

Gahle

[11] Patent Number: 5,071,777
[45] Date of Patent: Dec. 10, 1991

[54] METHOD OF FABRICATING IMPLANTED WELLS AND ISLANDS OF CMOS CIRCUITS

[75] Inventor: Hans-Juergen Gahle, Emmendingen, Fed. Rep. of Germany

[73] Assignee: Deutsche ITT Industries GmbH, Freiburg, Fed. Rep. of Germany

[21] Appl. No.: 231,337

[22] Filed: Aug. 12, 1988

[30] Foreign Application Priority Data

Aug. 18, 1987 [EP] European Pat. Off. ........ 87111946.7
Apr. 15, 1988 [EP] European Pat. Off. ........ 88106003.2

[51] Int. Cl.$^5$ .......................................... H01L 21/265
[52] U.S. Cl. ...................................... 437/29; 437/30; 437/34; 437/57
[58] Field of Search ................ 437/27, 28, 29, 30, 437/34, 57, 72

[56] References Cited

U.S. PATENT DOCUMENTS 4,306,916 12/1981 Wollesen et al. ................ 437/983
4,717,683 1/1988 Parrillo et al. ..................... 437/34

FOREIGN PATENT DOCUMENTS 0144248 6/1985 European Pat. Off.
59-150467 8/1984 Japan ................................. 437/34
60-21541 2/1985 Japan ................................. 437/72
61-242036 10/1986 Japan ................................. 437/72

OTHER PUBLICATIONS

IEEE Electron Device Letters, EDL-7 (1986), pp. 124-126, H-H. Tsai et al., "A New Fully Recessed-Oxide (FUROX) Field Isolation Technology for Scaled VLSI Circuit Fabrication".
Journal of the Electrochemical Society, Book 134, No. 6, Jun. 1987, pp. 1503-1507, Manchester, NH, US: K. Sakuma et al., "A New Self-Aligned Planar Oxidation Technology".
IEEE Transactions on Electron Devices, Book 35, No. 3, Mar. 1988, pp. 275-284, IEEE, New York, US; H-H Tsai et al., "An Evaluation of FUROX Isolation Technology for VLSI/nMOSFET Fabrication".
1046B Extended Abstracts; 87-1 (1987) Spring, No. 1, Philadelphia, PA, USA, Abstract No. 154 P 213-214.
A Retrograde p-Well for Higher Density CMOS; IEEE Transactions on Electron Devices, vol. Ed-28, No. 10, Oct. 1981; by Robert D. Rung, Conrad J. Dell-'oca and Laurence G. Walker; pp. 1115-1119.
Proceedings of the IEEE 1985 Custom Integrated Circuits Conference, The Portland Hilton, Portland, Oregon, USA, May 20-23, 1985; pp. 199-202; Optimized Retrograde N-Well for One Micron CMOS Technology; By Russel A. Martin & John Y. Chen.

Primary Examiner—Olik Chaudhuri
Assistant Examiner—M. Wilczewski
Attorney, Agent, or Firm—Thomas L. Peterson

[57] ABSTRACT

A method is disclosed for forming implanted wells and islands of CMOS integrated circuits with a retrograde profile, i.e., with wells and islands having a smaller penetration depth, shallower doping profile, and less lateral diffusion than in conventional CMOS circuits.

15 Claims, 3 Drawing Sheets

METHOD OF FABRICATING IMPLANTED WELLS AND ISLANDS OF CMOS CIRCUITS

BACKGROUND OF THE INVENTION

1. Field of the Invention

The present invention relates to a method of fabricating implanted wells and islands of CMOS circuits in silicon based large-scale-integrated complementary insulated-gate field-effect transistor circuits. The islands are of the substrate conductivity type with the wells having the opposite conductivity type.

2. Description of the Prior Art

With the conventional, standard CMOS process, the well takes up a relatively large amount of space. To increase the packing density, the depth of the well must be reduced. This, however, would increase the vertical current gain of parasitic bipolar transistors and, thus, increase the risk of latch-up.

One solution is the retrograde-well process described in the journal "IEEE Trans. Electron. Dev.", October 1981, pp. 115 to 119. "Retrograde wells" are understood to include wells and islands with a shallower doping profile and reduced lateral diffusion in which the dopant concentration first increases with increasing depth and then decreases from a given point, unlike the situation in conventional wells where the dopant concentration decreases continuously with increasing depth. In this manner, the dopant concentration at the surface can be reduced to a low level as is needed by the MOS transistor, but the overall concentration can be kept high enough that the current gain of parasitic bipolar transistors will be sufficiently small.

In the process for forming retrograde wells, unlike in the conventional CMOS process, the oxidation at the edge region of the well, i.e., the field oxidation, is carried out first, and only then are the ions implanted, which is followed by a conventional brief annealing treatment.

If the conventional process is to be used to fabricate twin wells, i.e., two wells lying side by side and containing at least one p-channel transistor and at least one n-channel transistor, respectively, a second photomasking step using an inverse well mask is necessary. The doping of the field regions is then dependent on the fieldoxide thickness, the bevel of the field-oxide edge, and the well implantation. If the doping is to be controlled independently of these parameters, two additional masks are necessary for the field oxidation. This leads to increased spacings due to alignment tolerances.

BRIEF DESCRIPTION OF THE INVENTION

The object of the invention is to modify the process described in the above-mentioned printed publication in such a way that no additional masks are needed in the fabrication of twin wells while the advantages of the device produced with the prior art process are preserved. In particular, packing density is not decreased, and protection against latch-up is largely preserved. The invention will now be explained by way of example with reference to the accompanying drawings.

DETAILED DESCRIPTION OF THE PREFERRED EMBODIMENTS

Figure 1:
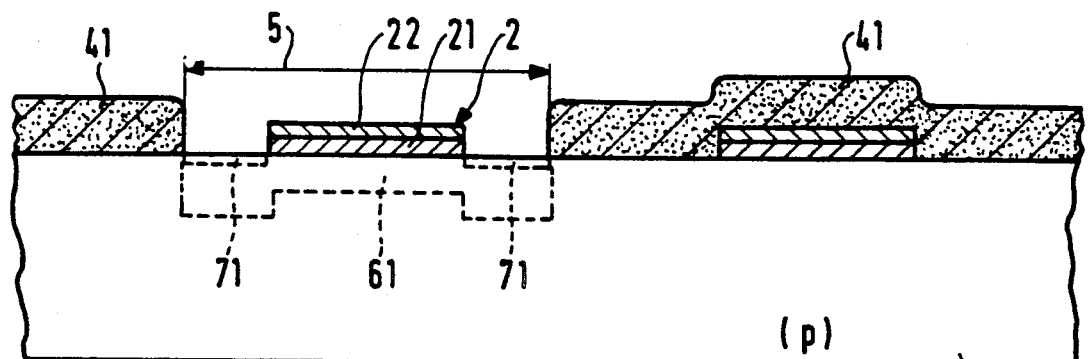
FIGS. 1 to 3 are schematic sectional views of the results of process steps during the fabrication of an embodiment of a CMOS circuit with n wells and p+ islands.

As shown in FIG. 1, which is not drawn to scale for the sake of clarity, the fabrication of the CMOS circuit starts with a p-type substrate 1, which may be provided with an epitaxial layer (not shown). On substrate 1 or the epitaxial layer, a thin silicon-dioxide layer 21 is formed in step a), preferably by thermal oxidation, "Thin" means that layer 21 has the usual thickness of a gate-oxide layer. Silicon-nitride layer 22 is then deposited on layer 21. These two layers 21, 22 form a double layer, collectively denoted by the reference numeral 2.

In step b), silicon-nitride layer 22 or entire double layer 2 is masked and etched by a conventional photoprocess—i.e., by applying a photoresist, exposing it through a mask, washing away the unexposed (or exposed) parts of the resist, and etching double layer 2 or layer 22, with the patterned photoresist working as a mask. The process is effected in such a way that the substrate surface (or only silicon-dioxide layer 21) is uncovered in an entire edge region 71 of the well to be formed, in an entire edge region 72 of the island to be formed (FIG. 2), and in an intermediate area 73 between the edge regions of the well and the island (FIG. 2), whereas in the internal areas of the well and the island, i.e., within the ring formed by the respective edge region, two layers 21, 22 are left (see FIGS. 1 and 2). Intermediate area 73 is not present if edge regions 71, 72 touch or slightly overlap one another.

In step c), a photoresist layer 41 is applied and then masked and etched to define an entire area 5 of an n-well 61 to be formed (well photoprocess). The photoresist layer 41 does not cover that portion of double layer 2 which lies in n-well area 5, but covers the portion of a double layer lying in an area 8 of a p+ island 62 to be formed.

In step d), a first implantation step in which high-energy phosphorus ions, for example, i.e., ions of the well conductivity type, are introduced with an acceleration voltage of about 300 kV and in which photoresist layer 41 acts as a mask, a well 61 is implanted (well implantation).

In step e), a second, low-energy implantation step in which phosphorus or arsenic ions, for example, are introduced with an acceleration voltage of about 40 kV and in which photoresist layer 41 and layers 21, 22 in the n-well area 5 act as masks, edge regions 71 are doped, which is to be n+ type (edge implantation I).

The results of the process steps described so far are shown in FIG. 1.

In step f), photoresist layer 41 is removed, and in step g), the implanted ions are driven in at a suitable temperature to form well 61 and its edge region 71.

In step h), an additional photoresist layer 42 is applied, masked, and etched. It covers well 61 but leaves area 8 of the p+ island to be formed uncovered, cf. FIG. 1 (island photoprocess).

Then, steps d) to g) are repeated as steps d') to g') using other dopants under other conditions.

In step d'), a third implantation step, island 62 is implanted. High-energy boron ions, for example, i.e., ions of the substrate conductivity type, are introduced with an acceleration voltage of about 180 kV, with the photoresist layer 42 performing the masking function (island implantation).

In step e'), a fourth implantation step with an energy lower than that of the island implantation, in which boron or BF$_2$ ions, for example, are introduced with an acceleration voltage of about 10 kV to 40 kV and in which photoresist layer 42 and layers 21, 22 in the area of the island 62 act again as masks, the edge region 72, which is to be a p$^{++}$ type region, is implanted (edge implantation II).

Figure 2:
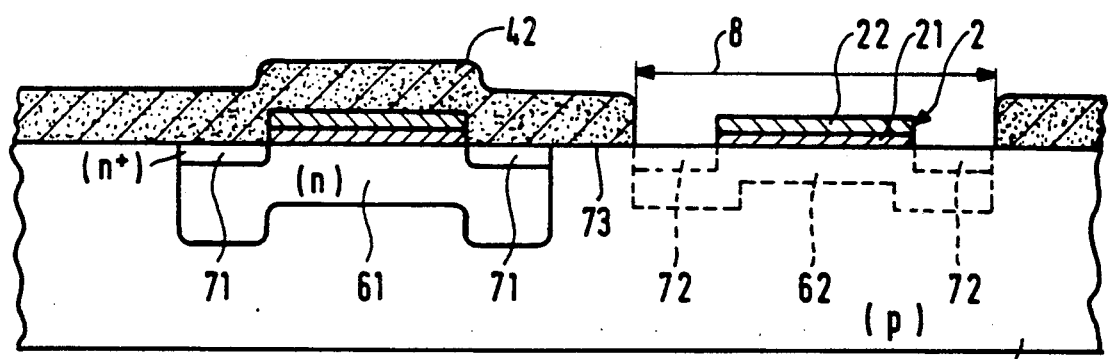

The results of the process steps described so far are shown in FIG. 2.

In step f'), the photoresist layer 42 is removed, and in step g'), the implanted ions are driven in at a suitable temperature to form p$^+$ type island 62 and its p$^{++}$ type edge region 72.

Finally, in step j), the edge regions 71, 72 and the intermediate area 73 are thermally oxidized to form the field-oxide layer 9, and the parts of double layer 2 which are still present, i.e., above the internal area of the well 61 and island 62, are removed by etching.

Figure 3:
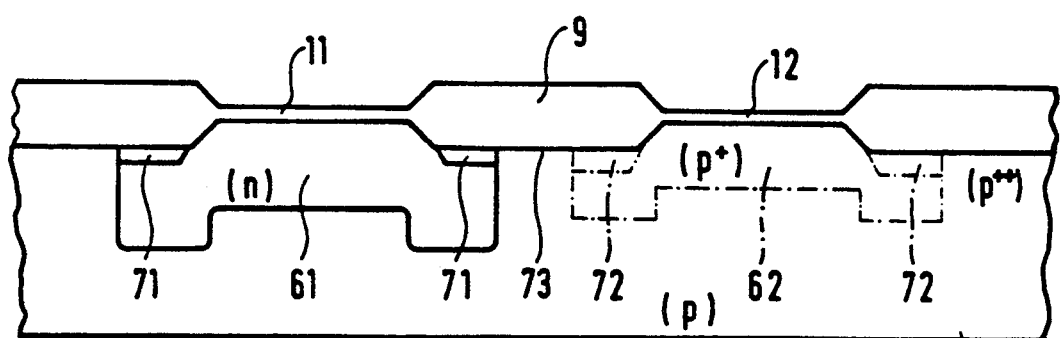

During subsequent processing, in a first step, gate-oxide layers 11, 12 will generally be formed on the above-mentioned internal areas by thermal oxidation. The result is shown in FIG. 3. The desired CMOS circuits are then finished in the usual manner.

Alternatively to the above-described steps of driving in the implanted ions of the substrate conductivity type, such as boron ions, after removal of photoresist mask 42 and the subsequent formation of the field-oxide layer, in a preferred embodiment of the invention, these two steps are combined; step g') is thus performed together with step j).

In another embodiment of the invention, the ions of the substrate and well conductivity types, e.g., boron and phosphorus ions, instead of being driven in separately, are driven in together in a step combined with the field oxidation, whereby approximately the same penetration depth is obtained in well and the island; steps g) and g') are thus performed during step j).

As shown in FIGS. 1 to 3, the surface of substrate 1 obtained by the method described is rather uneven, which may provide a disturbance to subsequent process steps.

The development of the invention which will now be explained with the aid of FIGS. 4 to 9 results in a substrate containing wells and islands having a virtually flat surface. The development comprises the fact that after step f) and before step h), steps k) to n) are performed.

Figure 4:
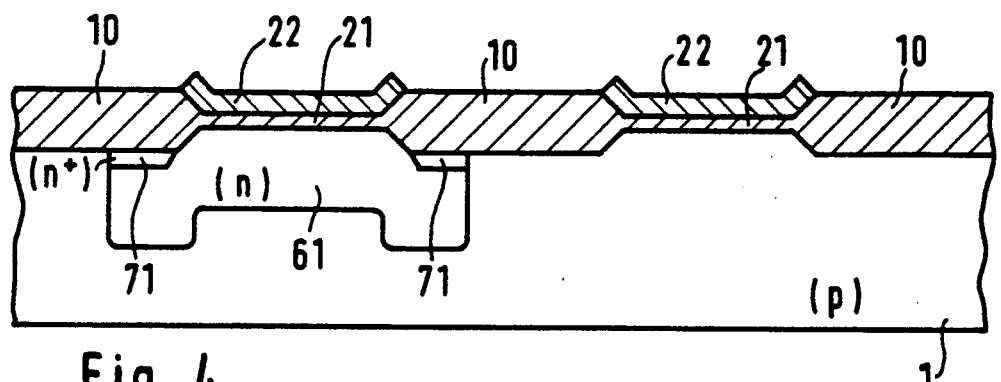
FIGS. 4 to 9 are schematic sectional views of the results of process steps during the fabrication of an embodiment of a development of a CMOS circuit with n wells and p+ islands.

In step k), the portion of the substrate surface covered by two layers 21, 22 is thermally oxidized during step g) to form a thick oxide layer 10, which is thus comparable to, and is about half as thick as, field-oxide layer 9. In step k), thick oxide layer 10 is thus formed together with the well; the result is shown in FIG. 4.

Figure 5:
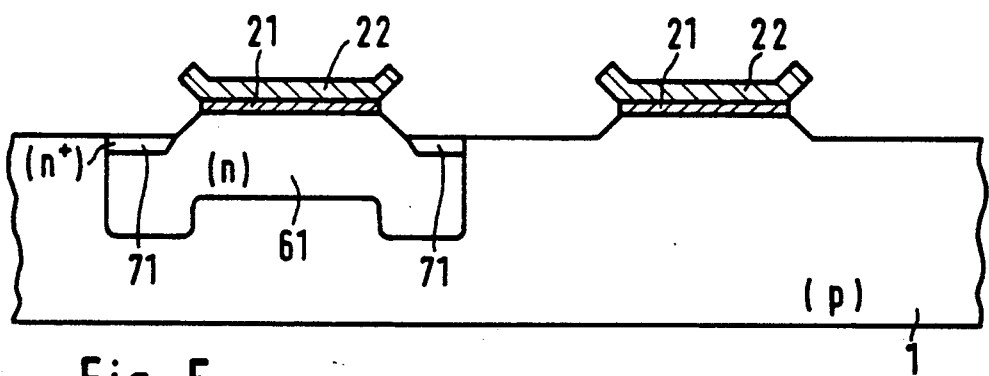

In step l), thick oxide layer 10 is etched away without the use of a mask; the result is shown in FIG. 5.

Figure 6:
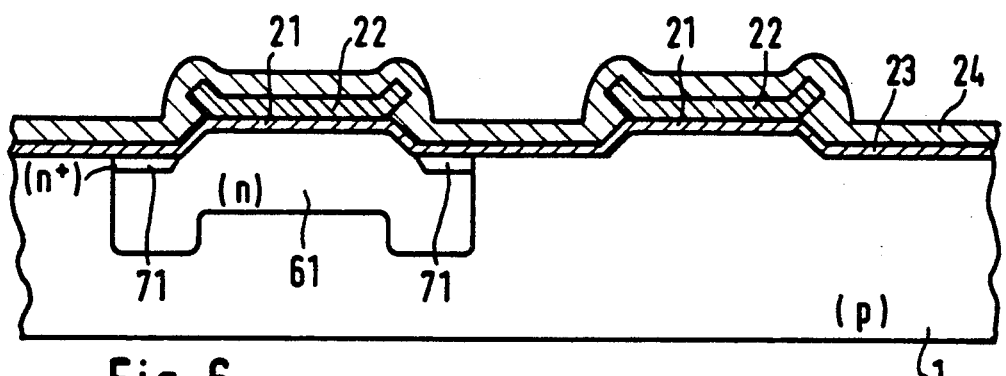
Figure 7:
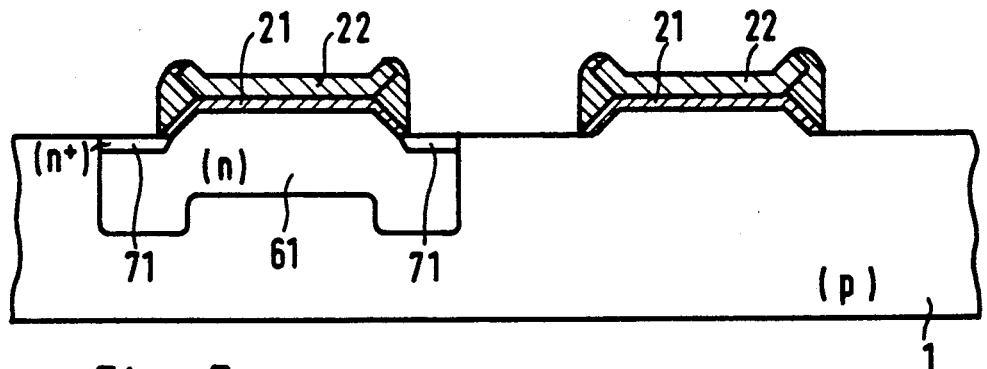

In step m), the exposed parts of the substrate surface are thermally oxidized to form the thin silicon-dioxide layer 23, on which an additional silicon-nitride layer 24 is deposited; the result is shown in FIG. 6.

In step n), silicon-nitride layer 24 is etched anisotropically, i.e., perpendicular to the substrate surface. This give the structure shown in FIG. 7, in which laterally below the upwardly included portion of the nitride layer 22 caused by the formation of the thick oxide layer, there is a remainder of the nitride layer 24 which has a surface or wall substantially perpendicular to the substrate.

Figure 8:
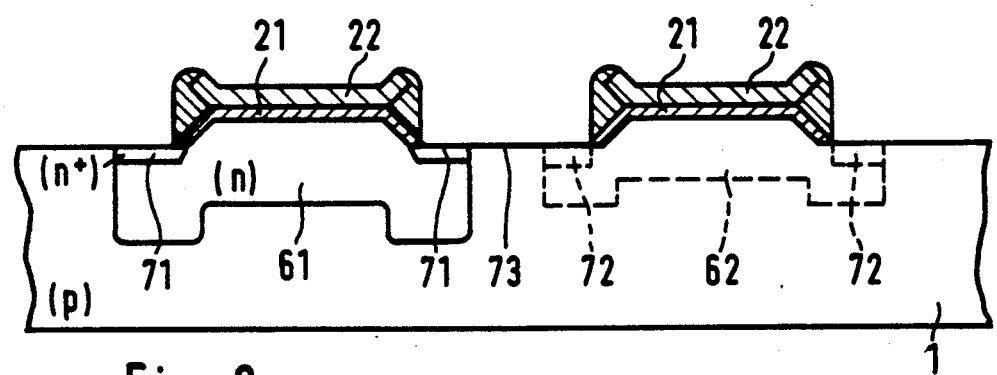
Figure 9:
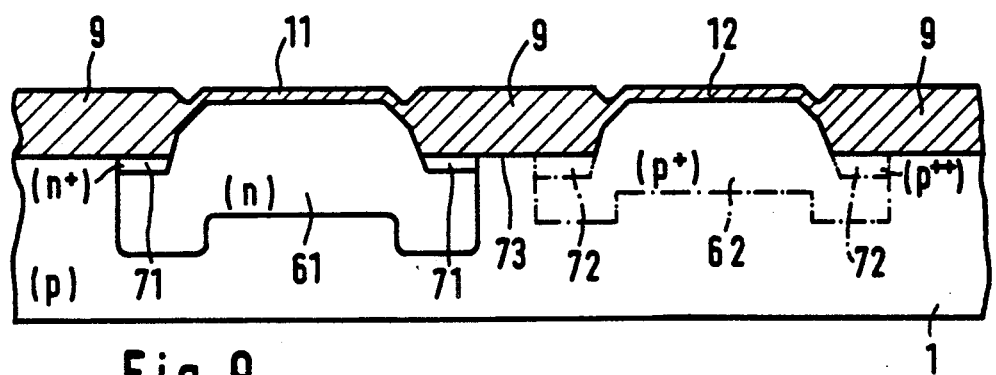

Step n) is followed by steps h), i) (which is equivalent to d'), e'), f'), g') and j). FIG. 8 shows the structure after step f'), and FIG. 9 that after step j) and after the above-mentioned analogous formation of gate-oxide layers 11, 12.

The method according to the invention is not only suited for fabricating the wells and islands of pure CMOS circuits, but can also be used to fabricate wells and islands of combined bipolar-CMOS circuits.

The development shown in FIGS. 4 to 9 can be used analogously for pure N-channel circuits.

I claim:

1. A method of fabricating substantially planar implanted wells and islands of CMOS integrated circuits of silicon, where in a substrate of a first conductivity type at least one well of an opposite second conductivity type is defined, and in the vicinity thereof, at least one island of said substrate conductivity type is defined, which island is doped more heavily than said substrate, said well and island being formed by several ion implantations using photoresist and silicon-dioxide/silicon-nitride mask structures, comprising the steps:

a) forming a thin silicon-dioxide layer on said substrate and a thin silicon-nitride layer on said thin silicon-dioxide layer;

b) selectively etching at least said silicon-nitride layer so that only a selected surface is uncovered throughout an edge area of said well to be formed and throughout an edge area of said island to be formed and in any intermediate area between said edge areas of said well and of said island, said thin silicon-dioxide and thin silicon-nitride layers in internal areas defined within and by said edge areas of said well and said island remaining;

c) depositing a photoresist layer, masking and etching it to define an entire area of said well, said entire area including said edge area and internal area of said well;

d) implanting high-energy ions of said conductivity type of said well using said photoresist layer as a mask;

e) implanting low-energy ions of said conductivity type of said well using said photoresist layer and said thin silicon dioxide and thin silicon-nitride layers as a mask;

f) removing said photoresist layer;

g) driving in said implanted ions to form said well and said corresponding edge area, which is doped more heavily than remaining portions of said well;

k) simultaneously during g) of Claim 21 selectively oxidizing said substrate surface not covered by said thin silicon-dioxide and thin silicon-nitride layers to form a thick oxide layer;

l) etching away said thick oxide layer without use of a mask;

m) oxidizing exposed parts of said substrate surface to form an additional thin silicon-dioxide layer and forming an additional silicon-nitride layer on said additional thin silicon-dioxide layer;

n) etching away said additional silicon-oxide and silicon-nitride layer anisotropically;

h) depositing a second photoresist layer, masking and etching it to define said entire area of said island, said entire area including said edge area and said internal area of said island;

d') implanting high-energy ions of the same conductivity type as said substrate to form said island and said corresponding edge area, which is doped more heavily than remaining portions of said island, and using said photoresist layer as a mask;

e') implanting low-energy ions of said conductivity type of said island using said photoresist layer and said thin silicon dioxide and thin silicon-nitride layers as a mark;

f') removing said photoresist layer;

g') driving in said implanted ions to form said island and said corresponding edge area, which is doped more heavily than remaining portions of said island;

j) oxidizing at least said exposed edge areas of said well and island to form a field-oxide layer thereon, and subsequently removing said thin silicon-dioxide and silicon-nitride layers, and forming a thin gate silicon-oxide layer over exposed portions of said well and island, whereby implanted wells and islands of CMOS integrated circuits with wells and islands having a small penetration depth, shallow doping profile, and little lateral diffusion are formed.

2. The method of claim 1, where said step of driving in said ions of said substrate conductivity type in step g') is performed together with step j).

3. The method as claimed in claim 2 where said steps of implanting a p well and $p^{\pm}$ island are performed by implanting high-energy boron ions, and said step of forming said corresponding edge area of said island is formed by implanting low-energy ions selected from the group consisting of boron and $BF2^+$.

4. The method of claim 3 where said steps of forming an n well and an $n^{\pm}$ island are performed by implanting doubly positively charged high-energy phosphorus ions, and said step of forming said corresponding edge area of said well is formed by implanting low-energy ions selected from the group consisting of phosphorus and arsenic.

5. The method of claim 1 where said steps of driving in said ions for forming said well in step g) and said island in step g') are performed together with step j).

6. The method as claimed in claim 5, where said steps of implanting a p well and $p^{\pm}$ island are performed by implanting high-energy boron ions, and said step of forming said corresponding edge area of said island is formed by implanting low-energy ions selected from the group consisting of boron and $BF2^{\pm}$.

7. The method of claim 5 where said steps of forming an n well and an $n^{\pm}$ island are performed by implanting doubly positively charged high-energy phosphorus ions, and said step of forming said corresponding edge area of said well is formed by implanting low-energy ions selected from the group consisting of phosphorus and arsenic.

8. The method of claim 1 where said steps of implanting a p well and $p^{\pm}$ island are performed by implanting high-energy boron ions, and said step of forming said corresponding edge area of said island is formed by implanting low-energy ions selected from the group consisting of boron and $BF2^{\pm}$.

9. The method of claim 1 where said steps of forming an n well and an $n^{\pm}$ island are performed by implanting doubly positively charged high-energy phosphorus ions, and said step of forming said corresponding edge area of said well is formed by implanting low-energy ions selected from the group consisting of phosphorus and arsenic.

10. The method of claim 1 where said steps of forming an n well and an $n^{\pm}$ island are performed by implanting doubly positively charged high-energy phosphorus ions, and said step of forming said corresponding edge area of said well is formed by implanting low-energy ions selected from the group consisting of phosphorus and arsenic.

11. A method of fabricating substantially planar implanted wells and islands of large-scale-integrated complementary silicon insulated-gate field-effect transistor circuits, where in a substrate of a first conductivity type, at least one well of the opposite second conductivity type and, in the vicinity thereof, a more heavily doped island of said first conductivity type are formed by several ion implantations using photoresist and silicon oxide and silicon nitride masking structures, comprising the following steps:

forming a silicon dioxide layer on said substrate and a silicon nitride layer on said silicon dioxide layer;

selectively disposing a photomask on said silicon dioxide and silicon nitride layers;

selectively exposing the surface of said substrate to define areas in which at least one well and island are to be formed by removing portions of said silicon dioxide and silicon nitride layers, while leaving said silicon dioxide and silicon nitride layers unchanged in the other areas of the surface of said substrate;

selectively disposing a photoresist layer to define the entire area of said one well;

implanting high-energy ions of said first conductivity type using said photoresist layer as a mask;

implanting low-energy ions of said first conductivity type using said photoresist layer and said silicon dioxide and silicon nitride layers as a mask;

removing said photoresist layer;

driving in the implanted ions to form said well and contiguous field regions;

selectively disposing another photoresist layer to define said island;

repeating said steps of implanting high-energy ions, of implanting low-energy ions, of removing said photoresist layer, of driving in the implanted ions to form said island and contiguous field regions, each repeated step using ions of said second conductivity type to form said island and contiguous field region;

further oxidizing exposed surface regions including contiguous field regions to said well and island to form a field oxide thereon simultaneously with said steps of driving in said implanted ions in said well and island; and removing said silicon nitride layer still present.

12. The method of claim 11 where in said step of forming said silicon dioxide and silicon nitride layers on said substrate, a p-type substrate is used.

13. The method of claim 11 where in said step of implanting high-energy ions of said first conductivity type, a p-well is formed by implanting high-energy boron ions, and where in said step of implanting low-energy ions ions, said contiguous field regions are formed by implanting low-energy ions selected from the group consisting of boron and $BF2^+$.

14. The method of claim 11 where in said step of implanting high-energy ions, an n-well is formed by implanting doubly positively charged high-energy phosphorous ions, and where in said step of implanting low-energy ions, said contiguous field regions are formed by implanting ions selected from the group consisting of phosphorous and arsenic ions.

15. The method of claim 11 where in said step of driving in said ions of said second conductivity type is performed simultaneously with said step of oxidizing;
where in said steps of driving in said ions for forming said well and island are performed together with step of oxidizing;
where in said step of implanting high-energy ions of said first conductivity type, a p-well is formed by implanting high-energy boron ions, and where in said step of implanting low-energy ions, said contiguous field regions of said well are formed by implanting low-energy ions selected from the group consisting of boron and BF2; and
where in said step of implanting high-energy ions, an n-well is formed by implanting doubly positively charged high-energy phosphorous ions, and where in said step of implanting low-energy ions, said contiguous field regions of said well are formed by implanting ions selected from the group comprising phosphorous and arsenic ions.

* * * * *